(12) United States Patent
Furuta et al.

(10) Patent No.: US 7,808,056 B2
(45) Date of Patent: Oct. 5, 2010

(54) SEMICONDUCTOR INTEGRATED CIRCUIT DEVICE

(75) Inventors: Hiroshi Furuta, Kanagawa (JP); Junji Monden, Kanagawa (JP); Shouzou Uchida, Kanagawa (JP); Muneaki Matsushige, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 61 days.

(21) Appl. No.: 11/907,327

(22) Filed: Oct. 11, 2007

(65) Prior Publication Data

US 2008/0099857 A1     May 1, 2008

(30) Foreign Application Priority Data

Oct. 30, 2006    (JP)  ............................ 2006-294755

(51) Int. Cl.
*H01L 27/088* (2006.01)
(52) U.S. Cl. ................. 257/401; 257/288; 257/E29.245
(58) Field of Classification Search ................ 257/401, 257/213, 288, 368, E29.345, E29.325, E29.166, 257/E29.001
See application file for complete search history.

(56) References Cited

U.S. PATENT DOCUMENTS

| | | | | |
|---|---|---|---|---|
| 6,097,066 A * | 8/2000 | Lee et al. | ..................... | 257/355 |
| 6,140,687 A * | 10/2000 | Shimomura et al. | ......... | 257/401 |
| 6,922,094 B2 | 7/2005 | Arima et al. | | |
| 7,016,214 B2 * | 3/2006 | Kawamata et al. | ............. | 365/63 |
| 7,067,368 B1 * | 6/2006 | Fang et al. | .................. | 438/199 |
| 7,250,661 B2 | 7/2007 | Takahashi et al. | | |

FOREIGN PATENT DOCUMENTS

| JP | 62-262462 | 11/1987 |
|---|---|---|
| JP | 9-330986 | 12/1997 |
| JP | 2003-273709 A | 9/2003 |

(Continued)

OTHER PUBLICATIONS

T. Calin et al., Topology-Related Upset Mechanisms in Design Hardened Storage Cells, RADECS98, Fourth European Conference on Radiation and Its Effect on Components and System, 1998, pp. 484-488.

(Continued)

*Primary Examiner*—Thomas L Dickey
*Assistant Examiner*—Nikolay Yushin
(74) *Attorney, Agent, or Firm*—Foley & Lardner LLP

(57) ABSTRACT

A semiconductor integrated circuit device includes a first field-effect transistor and a second field-effect transistor, each of the first field-effect transistor and the second field-effect transistor having a gate electrode formed as a ring shape, a drain diffusion layer formed inside the gate electrode and a source diffusion layer formed outside the gate electrode and a substrate potential diffusion layer or a well potential diffusion layer disposed to contact each of the source diffusion layers of the first and the second field-effect transistors of the same conductivity type, the substrate potential diffusion layer or the well potential diffusion layer being formed with a semiconductor of a different conductivity type from the source diffusion layer. Different signals are input to each of the gate electrodes, the substrate potential diffusion layer or the well potential diffusion layer are formed between the source diffusion layer of the first field-effect transistor and the source diffusion layer of the second field-effect transistor.

14 Claims, 15 Drawing Sheets

FOREIGN PATENT DOCUMENTS

JP        2005-159131 A    6/2005

OTHER PUBLICATIONS

D.C. Mayer et al., "Reliability Enhancement in High-Performance MOSFETs by Annular Transistor Design," IEEE Transactions on Nuclear Science, vol. 51:6, Dec. 2004, pp. 3615-3620.

K. Osada, "SRAM Immunity to Cosmic-Ray-Induced Multierrors Based on Analysis of an Induced Parasitic Bipolar Effect," IEEE Journal of Solid-State Circuits, vol. 39:5, May 2004, pp. 827-833.

E. Takeda et al., "A Cross Section of a-Particle-Induced Soft-Error Phenomena in VLSI's," IEEE Transactions on Electron Devices, vol. 36:11, Nov. 1989, pp. 2567-2575.

K Yuzuriha et al., A Large Cell-Ratio and Low Node Leak 16M-bit SRAM Cell Using Ring-Gate Transistors, 1991 International Electron Devices Meeting, pp. 485-488.

* cited by examiner

SEMICONDUCTOR INTEGRATED CIRCUIT DEVICE

BACKGROUND OF THE INVENTION

1. Field of the Invention

The present invention relates to a semiconductor integrated circuit, and especially to a semiconductor integrated circuit device having a field-effect transistor including a gate electrode formed as a ring shape, a source diffusion layer outside of this gate electrode and a substrate potential diffusion layer or a well potential diffusion layer formed outside the source diffusion layer.

2. Description of Related Art

In recent years, in semiconductor integrated circuit devices, miniaturization of manufacturing process and reduction of operating power supply voltage are developing. In such a semiconductor integrated circuit device, a soft error called Single Event Upset (SEU) occurs when radiation or the like hits a memory cell, a flip-flop circuit (hereinafter referred to as a F/F circuit) and a field-effect transistor for forming an information storage circuit such as a latch circuit and a logical circuit which is to be a transmitting channel of a signal (the field-effect transistor merely referred to as a transistor as appropriate). When this soft error occurs, logic information held in the transistor is reversed and there is a problem that a defect is generated in subsequent signal processing.

The countermeasure technique for this soft error is disclosed in Japanese Unexamined Patent Application Publication No. 2003-273709 (Arima, et al.). Arima, et al. discloses that a transistor is added to a circuit and suppressed generation of the soft error by devising the circuit configuration. Moreover, the related art discloses to suppress from generating the soft error by adding capacity to the information storage node of the circuit.

In order to reduce Soft Error Rate (SER), it is necessary to recognize the cause of the soft error. Thus, the cause of generating the soft error is explained hereinafter. Soft errors are generated by a carrier generated in a substrate region (including a well region of a transistor hereinafter) due to a burst of radiation or a charged particle into a diffusion layer of an information storage node. For example, when the information storage node diffusion layer formed with an N-type semiconductor holds high level (hereafter referred to as H level), if a charge flows into this node, the information storage node diffusion layer will become low level (hereafter referred to as L level) from H level. On the other hand, when the information storage node diffusion layer formed with a P-type semiconductor holds L level, if a charge flows into this node, the information storage node diffusion layer will become H level from L level. How the carriers generated in the substrate region are collected to the information storage node diffusion layer is disclosed in Eiji Takeda, et al., "A Cross Section of α-Particle-Induced Soft-Error Phenomena in VLSI's", IEEE TRANSACTION ON ELECTRON DEVICES, Vol. 36, No. 11, pp. 2567-2575, 1989.

Moreover, as another phenomenon of influencing SER, there is information reversal phenomenon due to parasitic bipolar transistor operation. If electrons and electron holes are generated in large quantities near a source diffusion layer of a transistor, a parasitic bipolar transistor which uses a source as an emitter, substrate as a base and a drain as a collector is formed. Operation of this parasitic bipolar transistor reduces (or increases) the potential of the drain and reverses the information stored in the node. This is disclosed in Kenichi Osada, et al., "SRAM Immunity to Cosmic-Ray-Induced Multierrors Based on Analysis of an Induced Parasitic Bipolar Effect", IEEE JOURNAL OF SOLID-STATE CIRCUITS, Vol. 39, No. 5, pp. 827-833, 2004.

The technique to suppress this information reversal by a parasitic bipolar transistor is disclosed in T. Calin, et al., "Topology-Related Upset Mechanisms in Design Hardened Storage Cells", RADECS98, Fourth European Conference on Radiation and Its Effect on Components and System, pp. 484-488, 1998 (Calin, et al.). In Calin, et al., BBD (Bulk Bias Diffusion, hereinafter referred to as a subcontact) is provided between source diffusion layers and between drain diffusion layers of adjacent transistors. Then in the related art, a potential of a substrate region is stabilized to suppress the parasitic bipolar transistor from operating.

However, miniaturized transistors in recent years have small size of devices and distance between adjacent devices is also close. Therefore, distance of an area having a potential to reverse approaches and a distance of the portion operating as a base region of a parasitic bipolar transistor becomes substantially shorter. This will make the parasitic bipolar transistor easier to operate, thus there is a problem that operation of a parasitic bipolar transistor cannot be sufficiently suppressed only by subcontact. This is explained below.

FIG. 18 is an example of the layout of a transistor according to a related art when viewed from the top. As shown in FIG. 18, the transistor of a related art has a subcontact (BBD in FIG. 18) between the source diffusion layers (S1 and S2) of adjacent transistors. Moreover, a cross-sectional diagram of the transistor taken along the line X19-X19' of FIG. 18 is shown in FIG. 19. As shown in FIG. 19, the subcontact is formed between the source diffusion layers (S1 and S2) of adjacent transistors. However, as for the transistor in recent years, the distance between source diffusion layer and drain diffusion layer has become extremely short by miniaturization. Therefore, the distance of the base region of a parasitic bipolar transistor (the distance between a drain diffusion layer D1 and a drain diffusion layer D2 in FIG. 19) is short and it is in the state where the parasitic bipolar transistor operates easily.

For example, when the drain diffusion layer D1 of a transistor Tr1 is L level and the drain diffusion layer D2 of a transistor Tr2 is H level, as the distance between the drain diffusion layer D1 and the drain diffusion layer D2 is short, a parasitic bipolar transistor using the drain diffusion layer D1 as an emitter, the drain diffusion layer D2 as a collector and a substrate region as a base operates. Operation of this parasitic bipolar transistor inverts H level of the drain diffusion layer D2 to L level.

In addition, as another example, the layout of a semiconductor device having a different layout from FIG. 18 when viewed from the top is shown in FIG. 20. In the semiconductor device shown in FIG. 20, transistors Tr1 and Tr2 are disposed to be adjacent. Then, drain diffusion layers of the two transistors are adjacent with a subcontact formed in between. Moreover, a transistor Tr3 is formed in the distant area from a source diffusion layer S2 of the transistor Tr2 so that the drain diffusion layer D3 may be on the side of the source diffusion layer S2.

Furthermore, a cross-sectional diagram of the transistor taken along the line X21-X21' of FIG. 20 is shown in FIG. 21. As shown in FIG. 21, a subcontact is formed between the drain diffusion layers (D1 and D2) of adjacent transistors. However, a parasitic bipolar transistor is formed between transistors Tr2 and Tr3 that are disposed to be adjacent without intervening the subcontact. In the example shown in FIG. 21, when the drain diffusion layer D3 of the transistor Tr3 is H level, a parasitic bipolar transistor using the source diffusion layer S2 as an emitter, a substrate region as a base and the drain diffusion layer D3 as a collector is formed. The operation of the parasitic bipolar transistor causes an information reversal, reversing the drain diffusion layer D3 of the transistor Tr3 from H level to L level.

On the other hand, when the drain diffusion layer D3 of the transistor Tr3 is L level and the drain diffusion layer D2 of the transistor Tr2 is H level, a parasitic bipolar transistor using the drain diffusion layer D3 as an emitter, a substrate region as a base and the drain diffusion layer D2 as a collector is formed. The operation of the parasitic bipolar transistor causes an information reversal, reversing the drain diffusion layer of the transistor Tr2 from H level to L level.

As a defect produced by operation of a parasitic bipolar transistor, there is latch-up. The latch-up is a defect in which a parasitic bipolar transistor operates and a current flows in a path different from the normal operation. The technique to deal with this latch-up is disclosed in Japanese Unexamined Patent Application Publication Nos. 2005-159131 and 62-262462.

In Japanese Unexamined Patent Application Publication No. 2005-159131, in order to stabilize a well potential of a transistor forming a SRAM (Static Random Access Memory), butted contact is used. This further stabilizes the well potential to suppress operation of a parasitic bipolar transistor Moreover, in Japanese Unexamined Patent Application Publication No. 62-262462, operation of a parasitic bipolar transistor is suppressed by a guard band diffusion layer surrounding a transistor. At this time, this guard band diffusion layer may be a butted contact structure. Moreover, in Japanese Unexamined Patent Application Publication No. 62-262462, the total dose effect generated by the quantity of received radiation is prevented. This total dose effect is a phenomenon in which device characteristics of a transistor are degraded by the quantity of received radiation (leakage characteristics degradation).

Moreover, the technique to prevent the degradation of the leakage characteristics by this total dose effect is disclosed in Donald C. Mayer, et al. and "Reliability Enhancement in High-Performance MOSFETs by Annular Transistor Design", IEEE TRANSACTION ON NUCLEAR SCIENCE, Vol. 51, No. 6, pp 3615-3620, 2004. A gate electrode formed as a ring shape is used in this technique. Other examples of using such transistor with a ring gate are disclosed in K. Yuzuriha, et al., "A Large Cell-Ratio and Low Node Leak 16M-bit SRAM Cell Using Ring-Gate Transistors", 1991 International Electron Devices Meeting, pp. 485-488, 1991, Japanese Unexamined Patent Application Publication No. 9-330986 and U.S. Pat. No. 6,097,066. The technique disclosed by K. Yuzuriha, et al. is to increase the effective area of a transistor by making a gate electrode a ring to reduce the cell size of SRAM. This example also discloses to reduce SER as the area of a memory node region is reduced.

In an example disclosed in Japanese Unexamined Patent Application Publication No. 9-330986, by forming a gate electrode as a rectangle or a ring and forming a diffusion layer corresponding to the gate electrode, when an α particle travels inside a semiconductor substrate, distance in which the particle travels a diffusion layer portion of a transistor is made shorter. In Japanese Unexamined Patent Application Publication No. 9-330986, by such layout, the amount of electric charge collection to an information storage node is reduced to improve SER.

The example disclosed in U.S. Pat. No. 6,097,066 is about a transistor having a gate electrode of ring shape used for a device for electro-static discharge protection (hereinafter referred to as a ESD protection device). In this transistor, a source diffusion layer is formed outside the gate electrodes formed in a ring shape and a substrate potential diffusion layer is formed further outside. Moreover, in this transistor, one transistor is formed by dividing into 4 transistor regions. Generally an ESD protection device connects each terminal of the transistor divided in this way to the same line. Moreover, in the normal operation of a semiconductor device, each terminal is connected so that the transistor may not operate.

We have now discovered that in related arts, there is a problem that it has not been sufficient to suppress the electric charge collection to an information storage node and a drain diffusion layer of a logical circuit and to prevent the information reversal by a parasitic bipolar transistor and thus SER has not been reduced sufficiently.

SUMMARY

In one embodiment, a semiconductor integrated circuit device includes a first field-effect transistor and a second field-effect transistor, each of the first field-effect transistor and the second field-effect transistor having a gate electrode formed as a ring shape, a drain diffusion layer formed inside the gate electrode and a source diffusion layer formed outside the gate electrode and a substrate potential diffusion layer or a well potential diffusion layer disposed to contact each of the source diffusion layers of the first and the second field-effect transistors of the same conductivity type, the substrate potential diffusion layer or the well potential diffusion layer being formed with a semiconductor of a different conductivity type from the source diffusion layer. Different signals are input to each of the gate electrodes of the first and the second field-effect transistors of the same conductivity type, the substrate potential diffusion layer or the well potential diffusion layer is formed between the source diffusion layer of the first field-effect transistor and the source diffusion layer of the second field-effect transistor and no isolation insulating film (STI) is disposed between the source diffusion layer of the first field-effect transistor and the source diffusion layer of the second field-effect transistor.

In the semiconductor integrated circuit device according to the present invention, the substrate potential diffusion layer or the well potential diffusion layer are disposed in the periphery of the source diffusion layer. Therefore, it is possible to prevent a bias in forward direction to the source diffusion layer and the substrate potential diffusion layer or the well potential diffusion layer. Thus, a parasitic bipolar transistor which uses the source diffusion layer as an emitter and the substrate potential diffusion layer or the well potential diffusion layer as a base region does not operate. Moreover, the source diffusion layer and the substrate potential diffusion layer exist in the surroundings of the drain diffusion layer inside the gate electrode formed as a ring shape. Accordingly, charges are not collected focusing on the drain diffusion layer.

The semiconductor integrated circuit device of the present invention can prevent both the information reversal by a parasitic bipolar transistor operation and the information reversal generated by a charge collection to an information storage node.

BRIEF DESCRIPTION OF THE DRAWINGS

The above and other objects, advantages and features of the present invention will be more apparent from the following description of certain preferred embodiments taken in conjunction with the accompanying drawings, in which.

DETAIL DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Hereafter, an embodiment of the present invention is described with reference to the drawings. A semiconductor integrated circuit device according to the present invention has a plurality of field-effect transistors and reduces SER with the shape of the field-effect transistors. In the following explanation, MISFET (Metal Insulator Semiconductor Field Effect Transistor) is explained as an example of a field-effect transistor. Note that for the MISFET, there is NMISFET (hereinafter referred to as an NMIS transistor) in which gate/source diffusion layers are formed with a semiconductor of a first conductivity type (for example N type) and PMISFET (hereinafter referred to as an PMIS transistor) in which drain/source diffusion layers are formed with a semiconductor of a second conductivity type (for example P type). In the first embodiment, as an aspect of the present invention, 2 NMIS transistors are explained among the plurality of field-effect transistors formed in the semiconductor integrated circuit device. Note that for PMIS transistor, the conductivity type of the semiconductor forming a diffusion layer may be changed as appropriate.

Figure 1:
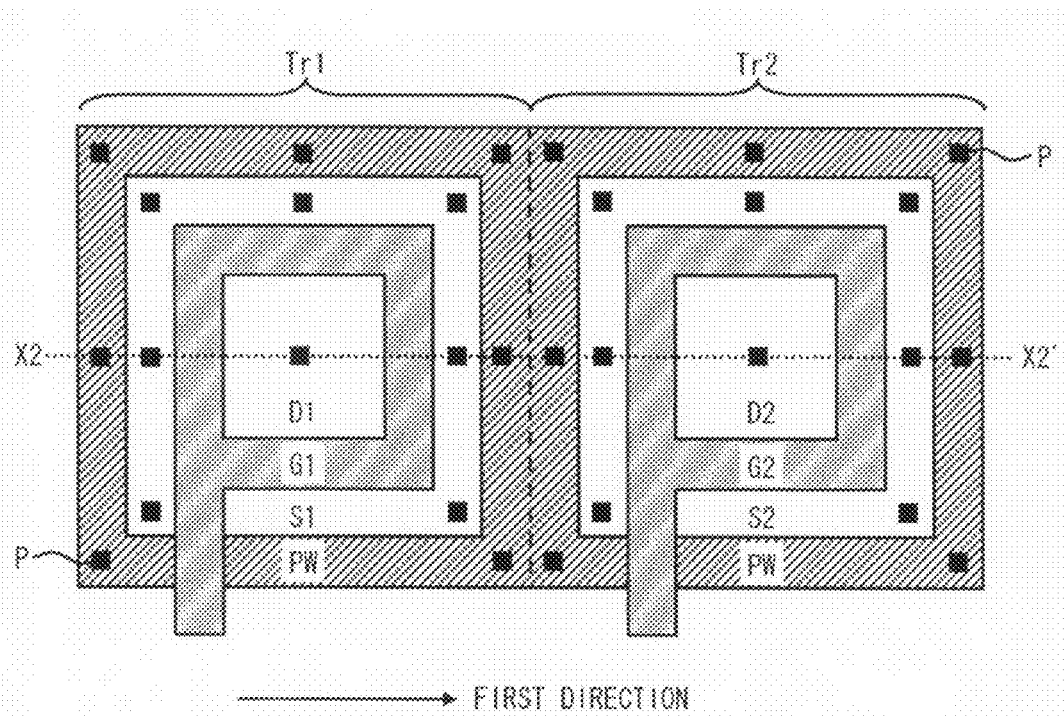
FIG. 1 is a layout diagram of a field-effect transistor according to a first embodiment.

The layout diagram shown in FIG. 1 shows the 2 NMIS transistors viewed from the top. As shown in FIG. 1, NMIS transistors Tr1 and Tr2 are formed to be adjacent in the semiconductor integrated circuit device of this embodiment. Then, a substrate potential diffusion layer PW is formed to surround each of a source diffusion layer S1 of the NMIS transistor Tr1 and a source diffusion layer S2 of the NMIS transistor Tr2. Note that in FIG. 1, in order to explain the NMIS transistors Tr1 and Tr2, the boundary line of the transistors is shown by the dashed line over the substrate potential diffusion layer PW for convenience, however the substrate potential diffusion layer PW is formed in an integrated manner. Moreover, in the following explanation, a diffusion layer contacting the source diffusion layer, formed to surround the periphery of the source diffusion layer and having a conductivity type different from the source diffusion layer is noted as a butted contact diffusion layer for convenience. This butted contact diffusion layer is a substrate potential diffusion layer or a well potential diffusion layer.

Here, the NMIS transistor according to this embodiment is described in more detail. As shown in FIG. 1, the NMIS transistor Tr1 includes a gate electrode G1, a drain diffusion layer D1 and the source diffusion layer S1. The gate electrode G1 is formed as a ring shape (shown as a rectangular ring in the example of FIG. 1). Then, the drain diffusion layer D1 is formed to fill inside of the gate electrode G1. The source diffusion layer S1 is formed to surround the periphery of the gate electrode G1. Moreover, the substrate potential diffusion layer PW is formed to contact the source diffusion layer S1 and surround the periphery of the source diffusion layer S1. Note that in FIG. 1, although the gate electrode has come out of the substrate potential diffusion region PW and divides the substrate potential diffusion region, since the gate electrode is ultrathin, influence in suppressing the parasitic bipolar transistor operation described later and electric charge collection at the time of radiation incidence can be disregarded. If necessary, the gate electrode may be made not to come out of the substrate potential diffusion layer to take the potential of the gate electrode (not shown).

The drain diffusion layer D1 and the source diffusion layer S1 are formed with semiconductor of an N type in this embodiment. On the other hand, the substrate potential diffusion layer PW is formed with semiconductor of a P type. Moreover, the gate electrode G1 is formed with polysilicon etc. Here, since the field-effect transistor according to this embodiment is a NMIS transistor, the source diffusion layer S1 and the substrate potential diffusion layer PW shall be connected to a ground potential VSS via contacts (for example plug contacts P). Moreover, the drain diffusion layer D1 is connected to other devices via the plug contacts P. Then, although not shown, the gate electrode G1 is input with signals from other devices via the plug contacts P.

On the other hand, the NMIS transistor Tr2 has a gate electrode G2, a drain diffusion layer D2 and the source diffusion layer S2 that have substantially the same shape as the NMIS transistor Tr1. Moreover, the substrate potential diffusion layer PW is formed to surround the periphery of the source diffusion layer S1 of the NMIS transistor Tr2. This substrate potential diffusion layer PW is formed in an integrated manner with the substrate potential diffusion layer PW by the side of the NMIS transistor Tr1. Note that different signals are input to the gate electrode G2 of the NMIS transistor Tr2 and the gate electrode G1 of the NMIS transistor Tr1. That is, the NMIS transistor Tr1 and the NMIS transistor Tr2 operate independently from each other.

Figure 2:
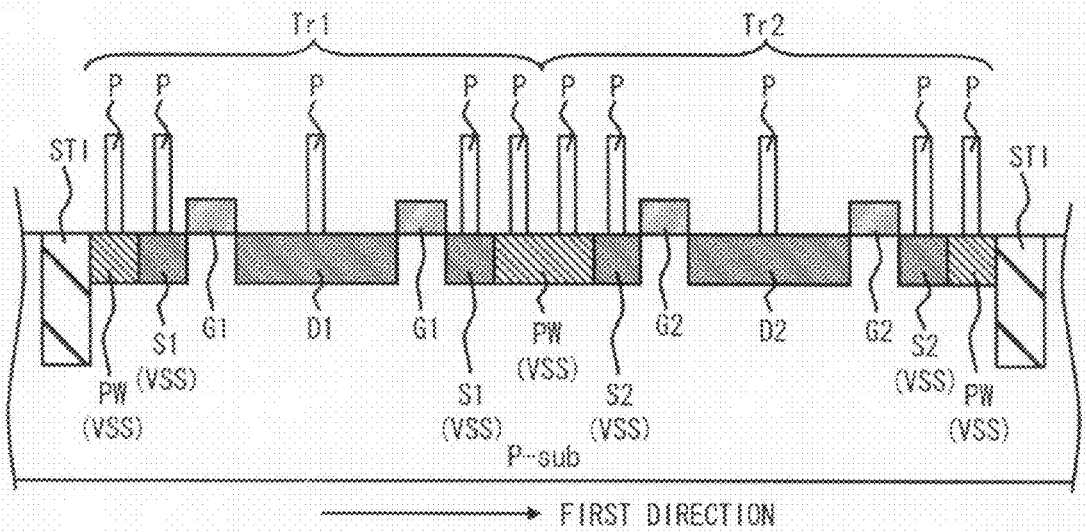
FIG. 2 is a cross-sectional diagram of the field-effect transistor according to the first embodiment.

A cross-sectional structure of the NMIS transistor shown in FIG. 1 is explained. A cross-sectional diagram of the portion taken along the line X2-X2' of FIG. 1 is shown in FIG. 2. Note that in the cross-sectional diagram of FIG. 2, additional portions such as gate sidewalls and a gate insulating film are not shown (omitted in cross-sectional diagrams in the following explanation similarly). As shown in FIG. 2, the source diffusion layers S1 and S2, the drain diffusion layers D1 and D2 that are formed with N type semiconductor, the substrate potential diffusion layer PW and an insulating film which isolates a device (ex. a device isolation insulating film STI) are formed selectively to the surface of a substrate region P-sub. Moreover, the gate electrodes G1 and G2 and plug contacts P are formed in the upper layer of the substrate region P-sub.

The drain diffusion layer D1 is formed near substantially the center among the regions in which the NMIS transistor Tr1 is formed and the drain diffusion layer D2 is formed near substantially the center among the regions in which the NMIS transistor Tr2 is formed. Moreover, the source diffusion layer S1 is formed to be adjacent to the drain diffusion layer D1 interposing the substrate region P-sub positioned in the lower part of the gate electrode G1. On the other hand, the source diffusion layer S2 is formed to be adjacent to the drain diffusion layer D2 interposing the substrate region P-sub positioned in the lower part of the gate electrode G2. Furthermore, the substrate potential diffusion layer PW is formed outside of the region in which the NMIS transistor Tr1 is formed and also the region in which the source diffusion layer S1 is in contact, and outside of the region in which the NMIS transistor Tr2 is formed and also the region in which the source diffusion layer S2 is in contact. Note that the substrate potential diffusion layer PW formed in the region between the source diffusion layer S1 and the source diffusion layer S2 is formed in an integrated manner.

The device isolation insulating film STI is formed with an insulating material such as silicon oxide. Then, in this embodiment, the device isolation insulating film STI is formed in the both ends of the region in which the substrate potential diffusion layer PW surrounding the NMIS transistors Tr1 and Tr2 and the periphery of the NMIS transistors Tr1 and Tr2 is formed. That is, in the NMIS transistor according to the first embodiment, in a first direction in which the transistors of the same conductivity type are adjacent with the substrate potential diffusion layer PW interposed therebetween, the device isolation insulating film STI does not exist between the field-effect transistors.

Then, the plug contacts P are formed in the upper layer of the substrate potential diffusion layer PW and the source diffusion layers S1 and S2. The substrate potential diffusion layer PW and the source diffusion layers S1 and S2 are connected to metal lines not shown via the plug contacts P and supplied with the ground potential VSS. Moreover, the plug contacts P are formed also in the upper layer of the drain diffusion layers D1 and D2 and connected to metal lines not shown. The drain diffusion layers D1 and D2 are connected to another device via the plug contacts P and the metal lines.

Figure 3:
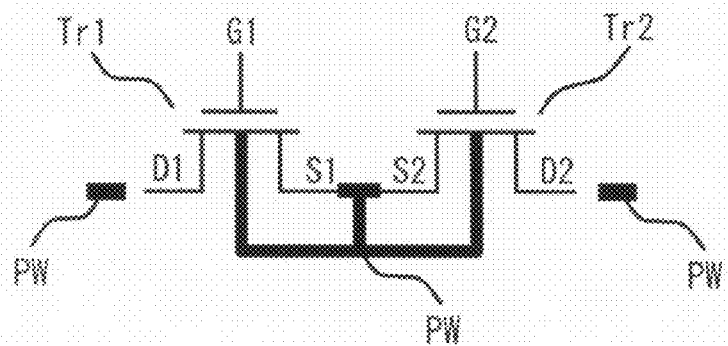
FIG. 3 is a representative circuit diagram of the field-effect transistor according to the first embodiment.

Here, the representative circuit diagram of the NMIS transistors Tr1 and Tr2 is shown in FIG. 3. As shown in FIG. 3, for the NMIS transistors Tr1 and Tr2, the source diffusion layers S1 and S2 and back gate regions are connected to each other by the substrate potential diffusion layer PW to be the same potential (for example the ground potential VSS). Moreover, although the drain diffusion layers D1 and D2 are not electrically connected with the substrate potential diffusion layer PW but surrounded by the substrate potential diffusion layer PW.

From the above explanation, a source diffusion layer is formed in the surroundings of the gate electrode formed as a ring shape in the NMIS transistor according to this embodiment. Furthermore, the source diffusion layer contacts the substrate potential diffusion layer PW and formed so that this substrate potential diffusion layer PW may surround the periphery. Then, both the source diffusion layer and the substrate potential diffusion layer PW are to be the same potential (for example the ground potential VSS). Thus, a potential difference is not caused between the base and the emitter in a parasitic transistor which uses the source diffusion layer as an emitter and uses the substrate region P-sub as the base. Therefore, this suppresses the parasitic bipolar transistor from operating. That is, it is possible to prevent information reversal of the information storagenode (for example drain diffusion layer) generated due to the operation of the parasitic bipolar transistor.

Moreover, the field-effect transistor according to this embodiment prevents operation of the parasitic bipolar transistor formed between adjacent field-effect transistors. For example, operation of a parasitic bipolar transistor can be considered which uses the source diffusion layer S1 or the drain diffusion layer D1 of a first transistor (for example the NMIS transistor Tr1) as an emitter, the substrate region P-sub as a base and the drain diffusion layer D2 of a second transistor (for example the NMIS transistor Tr2) as a collector. However, the substrate potential diffusion layer PW is formed in the surroundings of the drain diffusion layer D2 of the NMIS transistor Tr2 according to this embodiment. Therefore, in order for the substrate potential diffusion layer PW to stabilize the potential of the substrate region P-sub in the surroundings of the drain diffusion layer D2, the operation of the parasitic bipolar transistor formed between the NMIS transistors Tr1 and Tr2 is suppressed.

On the other hand, the field-effect transistor according to this embodiment is able to reduce the amount of charge collection to the information storage node. The field-effect transistor according to this embodiment has a drain diffusion layer inside the gate electrode formed as a ring shape and a source diffusion layer formed in the surroundings of the gate electrode formed as a ring shape. Then charges generated in the substrate region P-sub by an incident of radiation are distributed and collected in the drain diffusion layer and the source diffusion layer formed in the surroundings. That is, the field-effect transistor according to this embodiment can reduce the amount of charge collection to the drain diffusion layer to be an information storage node and prevents the information reversal by charge collection. The effect will become remarkable when such a field-effect transistor forms a part of a SRAM cell circuit.

That is, the field-effect transistor according to this embodiment prevents information reversal of an information storage node by suppressing a parasitic bipolar transistor from operating and reducing the amount of charge collection to the information storage node. Then the field-effect transistor according to this embodiment can reduce SER. Moreover, the layout of the NMIS transistor according to this embodiment can be devised in order to reduce the area of a device. Hereinafter, a modification of the NMIS transistor of the above explanation is explained.

Figure 4:
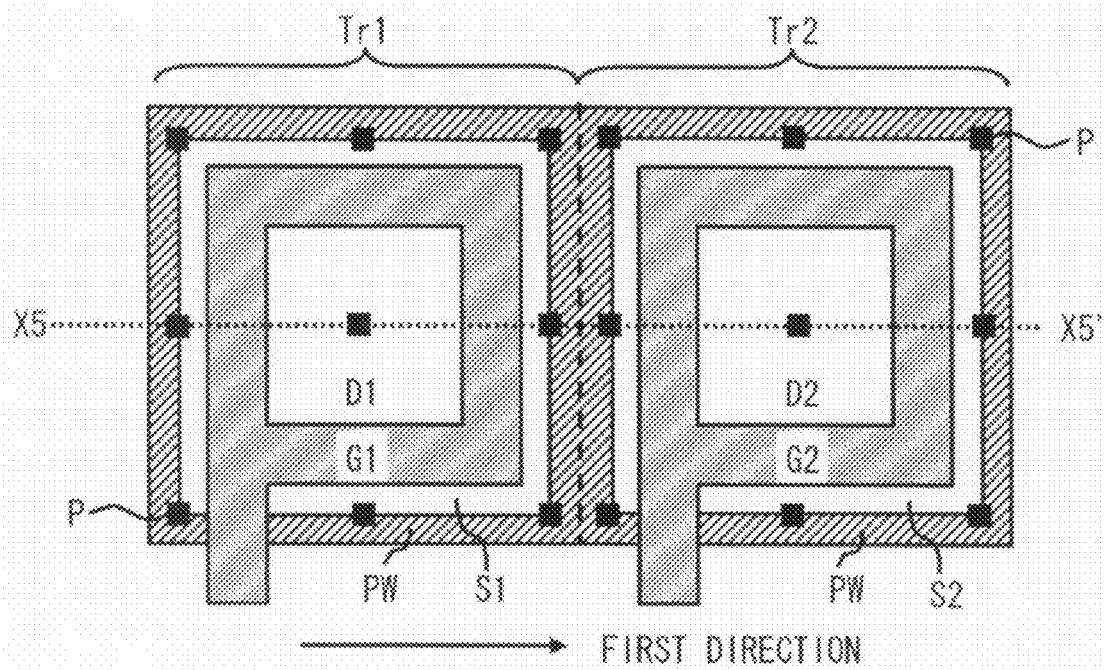
FIG. 4 is a layout diagram of a first modification of the field-effect transistor according to the first embodiment.

Firstly, FIG. 4 shows the layout of the NMIS transistor according to a first modification. As shown in FIG. 4, in the NMIS transistor according to the first modification, the width of the source diffusion layer S1 and S2 and the substrate potential diffusion layer PW is smaller than the NMIS transistor according to the abovementioned embodiment. Then, the plug contacts P are formed over the boundary line of the source diffusion layers S1 and S2 and the substrate potential diffusion layer PW.

Figure 5:
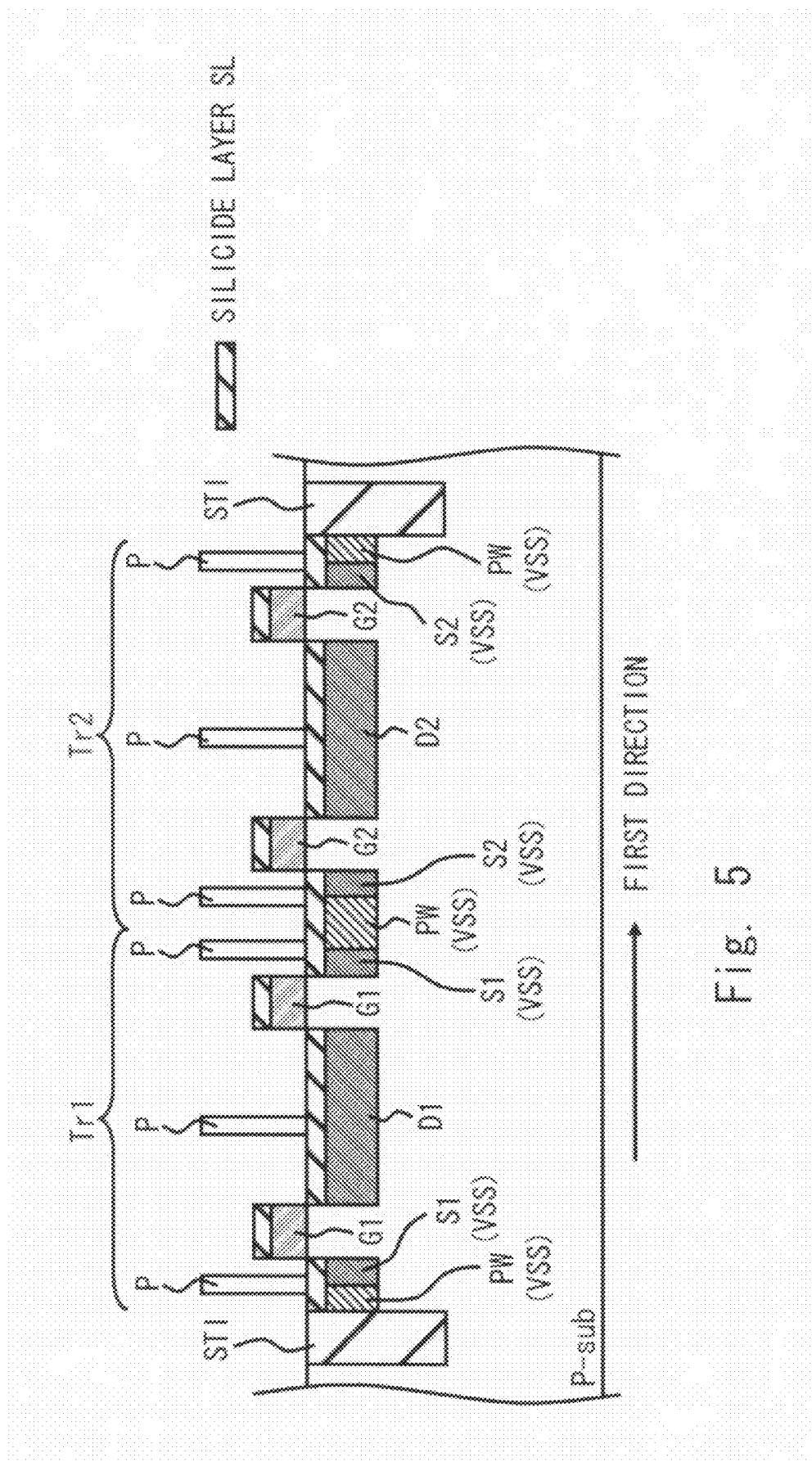
FIG. 5 is a cross-sectional diagram of the first modification of the field-effect transistor according to the first embodiment.

Here, the cross-sectional diagram of the NMIS transistor taken along the line X5-X5' of FIG. 4 is shown in FIG. 5. As shown in FIG. 5, as for the NMIS transistor according to the first modification, the surface of the substrate potential diffusion layer PW, the source diffusion layers S1 and S2, the gate electrodes G1 and G2 and the drain diffusion layers D1 and D2 is silicided (alloyed with metals such as silicon and titanium). Then in the NMIS transistor of the first modification, the source diffusion layers S1 and S2 and the substrate potential diffusion layer PW are electrically connected by the silicided diffusion layer (hereinafter referred to as a silicide layer SL). Then, the plug contact P is connected from the upper layer of the silicide layer SL. This makes the source diffusion layer and the substrate potential diffusion layer connected by the silicide layer SL be the same potential by one plug contact P.

That is, the NMIS transistor according to the first modification can reduce the number of the plug contacts P disposed between adjacent NMIS transistors. Moreover, it is possible to reduce the redundant regions of the substrate potential diffusion layer PW and the source diffusion layer and to reduce overall layout area.

Figure 6:
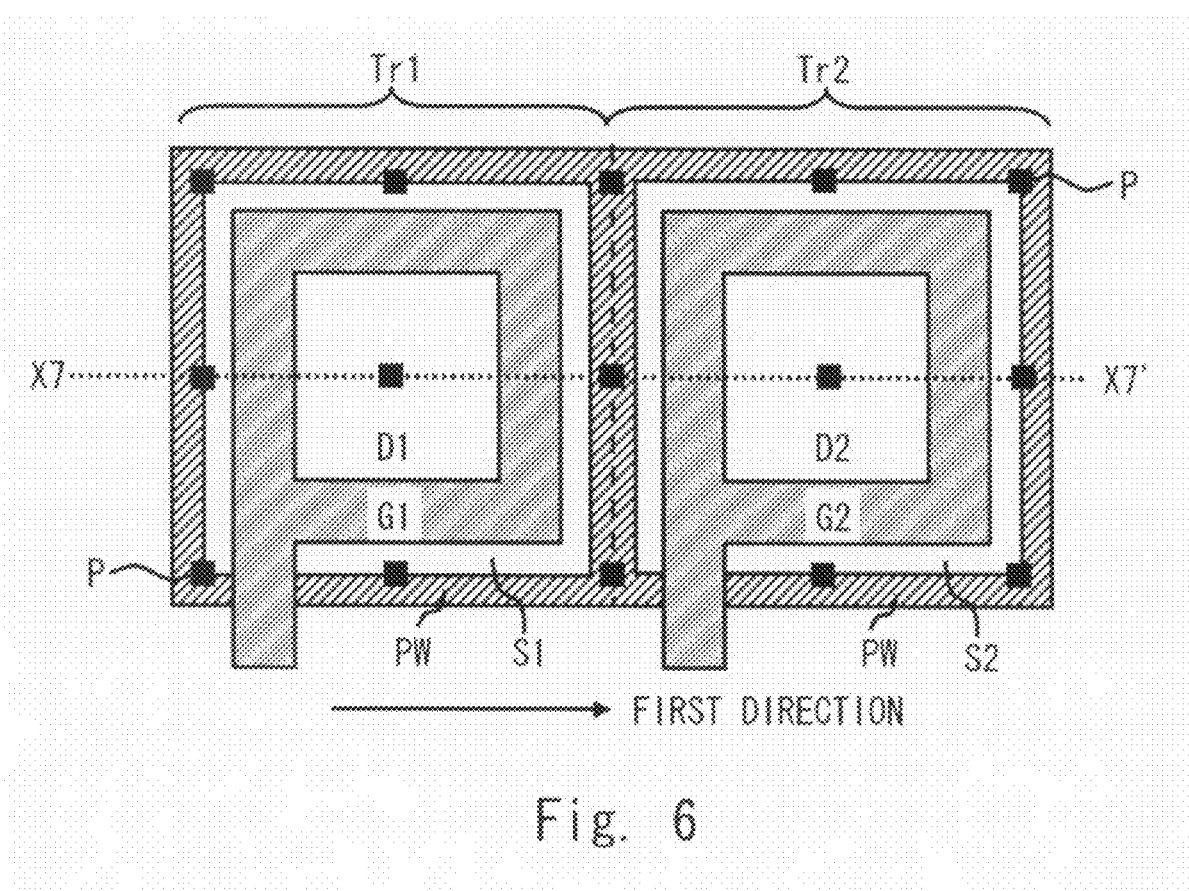
FIG. 6 is a layout diagram of a second modification of the field-effect transistor according to the first embodiment.

Next, a NMIS transistor according to a second modification is explained. The layout of the NMIS transistor according to the second modification is shown in FIG. 6. As shown in FIG. 6, in the second modification, the plug contacts P are included in the upper layer of the substrate potential diffusion layer PW between the NMIS transistors Tr1 and Tr2. Then, the plug contacts P are provided over the boundary line between the source diffusion layers S1 and S2 and the substrate potential diffusion layer PW and over the central line between the source diffusion layers S1 and S2 and the substrate potential diffusion layer PW.

Figure 7:
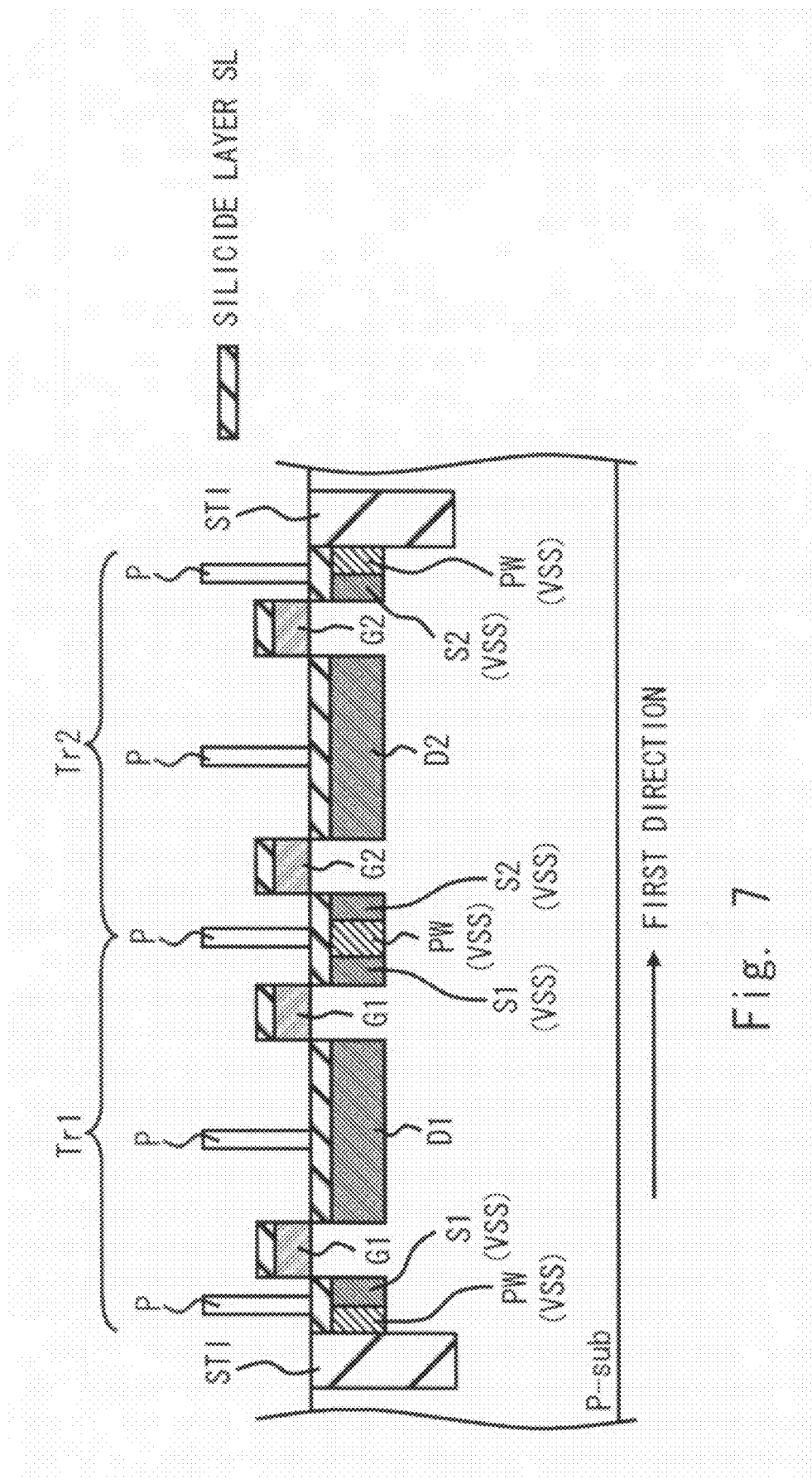
FIG. 7 is a cross-sectional diagram of the second modification of the field-effect transistor according to the first embodiment.

Moreover, the cross-sectional diagram of the NMIS transistor taken along the line X7-X7' of FIG. 6 is shown in FIG. 7. As shown in FIG. 7, as for the NMIS transistor according to the second modification, the device surface is silicided. That is, the source diffusion layers S1 and S2 and the substrate potential diffusion layer PW are electrically connected by the silicide layer SL. That is, by disposing one plug contact P in the upper layer of the silicide layer SL, a potential can be supplied in common to the source diffusion layers S1 and S2 and the substrate potential diffusion layer PW that are connected by the silicide layer SL. In the example shown in FIG. 7, one plug contact P is disposed in the upper part of the substrate potential diffusion layer PW.

The NMIS transistor of the second modification only requires one line of the plug contacts P disposed between the NMIS transistors Tr1 and Tr2, thus the area for the plug contacts P can be reduced more than the NMIS transistor of the first modification.

Figure 8:
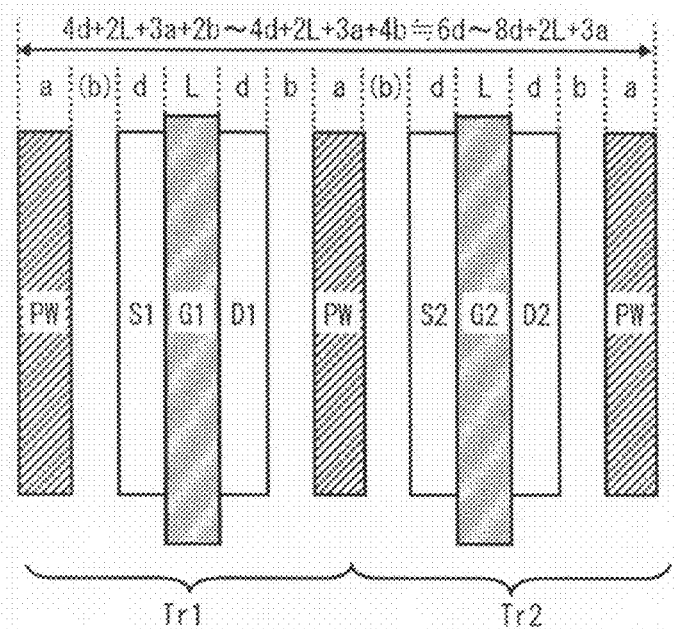
FIG. 8 shows the size of a general transistor according to a related art.

Here, the difference of the area between the NMIS transistor of the second modification and a general NMIS transistor of a related art is explained. The general NMIS transistor of a related art used for explanation is almost equivalent to the NMIS transistor according to the second modification except the performance regarding soft error. The layout of the general NMIS transistor is shown in FIG. 8. Furthermore, the layout diagram explaining the area of the NMIS transistor according to the second modification is shown in FIG. 9.

As shown in FIG. 8, the width in the first direction of the general NMIS transistor of a related art is about 4 d+2 L+3 a+4 b, where a is the width of the substrate potential diffusion layer PW, d is the width of the source diffusion layer and the drain diffusion layer, L is the gate length of the gate electrode and b is the width of the margin between the source diffusion layer or the drain diffusion layer and the substrate potential diffusion layer PW. Here, by making the substrate potential diffusion layer PW adjacent to the source diffusion layer has the butted contact structure, the width in the first direction of the general NMIS transistor of a related art will be about 4 d+2 L+3 a+2 b. Moreover, the width b of the margin of the source diffusion layer or the drain diffusion layer and the substrate potential diffusion layer PW is of the same degree as the width d of the source diffusion layer and the drain diffusion layer in a manufacturing process in recent years. Thus, the width in the first direction of the general NMIS transistor according to a related art is about 6 d+2 L+3 a to 8 d+2 L+3 a.

Figure 9:
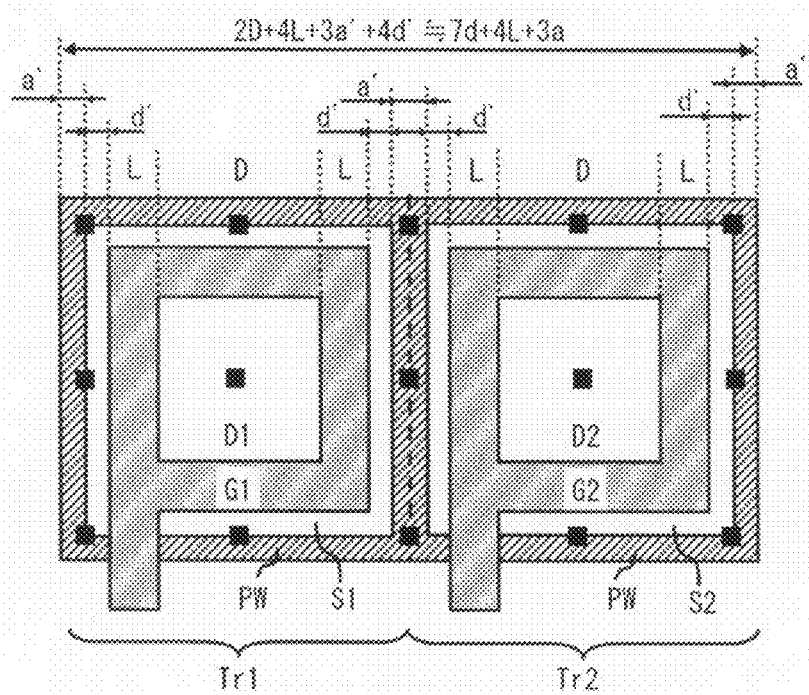
FIG. 9 shows the size of the field-effect transistor according to the first embodiment.

On the other hand, as shown in FIG. 9, the width in the first direction of the NMIS transistor according to the second modification is about 2 D+4 L+3 a'+4 d', where a' is the width of the substrate potential diffusion layer PW, d' is the width of the source diffusion layer, D is the width of the drain diffusion layer and L is the gate length of the gate electrode. Here the width a' of the substrate potential diffusion layer PW can be not more than the width a of the substrate potential diffusion layer PW of the general NMIS transistor. Moreover, the width d' of the source diffusion layer can be not more than the width d of the source diffusion layer and the drain diffusion layer of the general NMIS transistor. In the first and the second modification, the total width of the source diffusion layer and the substrate potential diffusion layer should just be enough to dispose the plug contacts P. Then, considering that the plug contacts P are disposed, the width D of the drain diffusion layer of the second modification is about 3 times of the width d of the source diffusion layer and the drain diffusion layer of the general NMIS transistor. Thus, the width in the first direction of the NMIS transistor according to the second modification will be substantially about 7 d+4 L+3 a.

That is, there is not a big difference between the width in the first direction of the NMIS transistor according to the second modification and the width in the first direction of the general NMIS transistor. That is, considering the tolerance over soft error, for the NMIS transistor of this embodiment, it is possible to remarkably improve soft error tolerance to an NMIS transistor of a related art without sacrificing area.

Second Embodiment

A semiconductor integrated circuit device according to a second embodiment includes a circuit using a plurality of the field-effect transistors of the first embodiment. As an example of the circuit, an inverter circuit group having a plurality of inverter circuits connected in series is described. The inverter circuit group connected in this way is used in an oscillator (for example ring oscillator) and a clock delay circuit or the like for forming a clock tree, for example.

Figure 10:
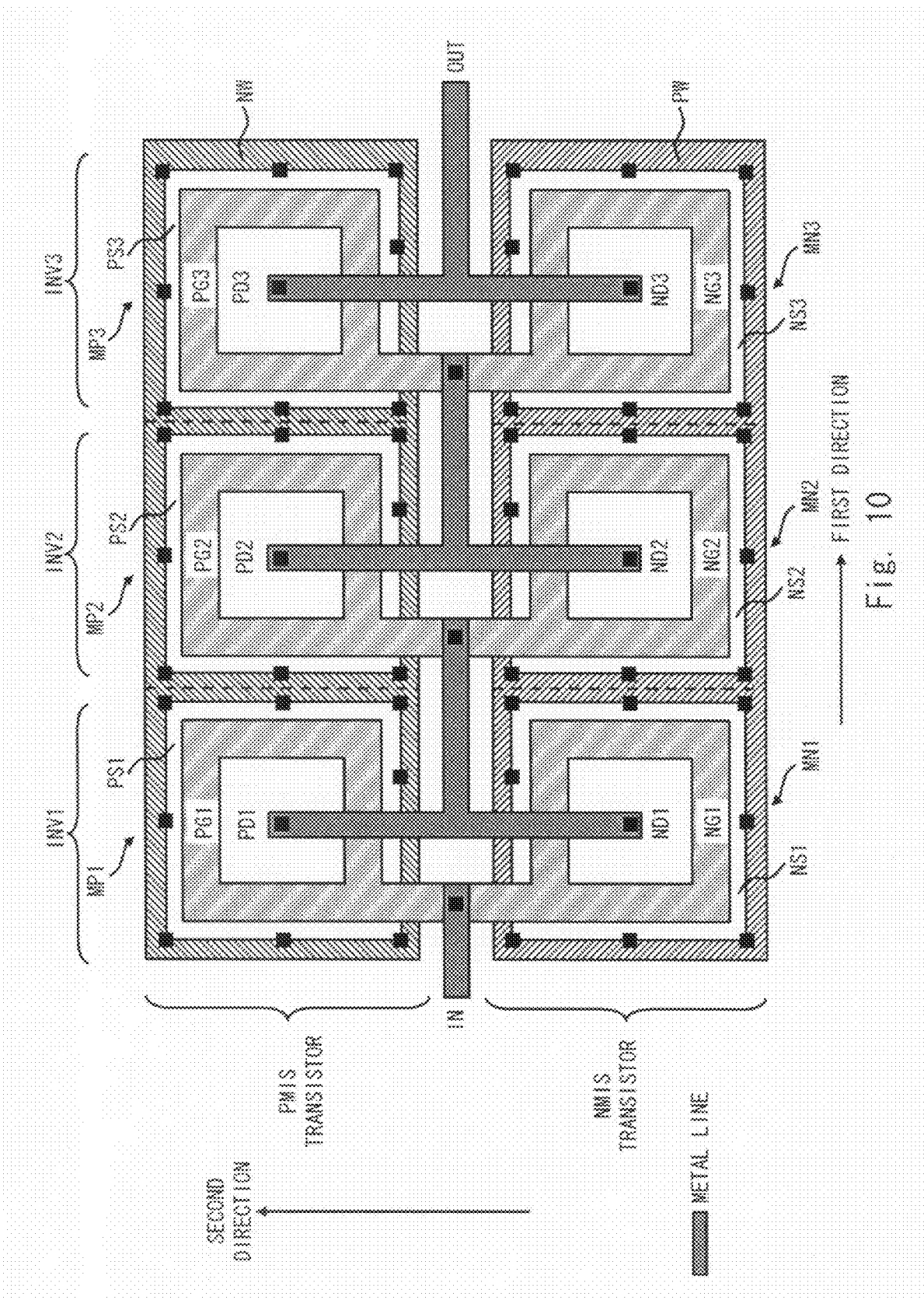
FIG. 10 is a layout diagram of a field-effect transistor according to a second embodiment.

FIG. 10 is a layout diagram of the inverter circuit group according to the second embodiment. As shown in FIG. 10, in the inverter circuit group, field-effect transistors of the same conductivity type are disposed in a first direction (for example direction from left to right in FIG. 10) and field-effect transistors of different conductivity type are disposed in a second direction (for example direction from bottom to top in FIG. 10) In the example shown in FIG. 10, a plurality of field-effect transistors of a first conductivity type (for example NMIS transistor) are disposed to the bottom toward the second direction and a plurality of field-effect transistors of a second conductivity type (for example PMIS transistor) are disposed to the upper part. Moreover, PMIS transistors are arranged in order of MP1, MP2 and MP3 from left-hand side of FIG. 10 and the NMIS transistors are arranged in order of MN1, MN2 and MN3 from right-hand side of FIG. 10

Then, a gate electrode PG1 of the PMIS transistor MP1 and a gate electrode NG1 of the NMIS transistor MN1 are connected to each other and an inverter circuit INV1 is formed by these two transistors. A gate electrode PG2 of the PMIS transistor MP2 and a gate electrode NG2 of the NMIS transistor MN2 are connected to each other and an inverter circuit INV2 is formed by these two transistors. A gate electrode PG3 of the PMIS transistor MP3 and a gate electrode NG3 of the NMIS transistor MN3 are connected to each other and an inverter circuit INV3 is formed by these two transistors.

Moreover, a signal is input to the gate electrodes PG1 and NG1 of the first inverter circuit INV1 from another circuit not shown via a metal line. Moreover, drain diffusion layers PD1 and ND1 of the first inverter circuit INV1 are connected to each other to be an output terminal of the first inverter circuit INV1. This output terminal is connected to the gate electrodes PG2 and NG2 of the second inverter circuit INV2. Drain diffusion layers PD2 and ND2 of the second inverter circuit INV2 are connected to each other to be an output terminal of the second inverter circuit INV2. This output terminal is connected to the gate electrodes PG3 and NG3 of the third inverter circuit INV3. Drain diffusion layers PD3 and ND3 of the third inverter circuit INV3 are connected to each other to be an output terminal of the third inverter circuit INV3. This output terminal is connected to another circuit not shown.

Although not shown, note that the power supply potential VDD is supplied to source diffusion layers and the well potential diffusion layers NW of the PMIS transistors MP1 to MP3 via metal lines. In addition, the ground potential VSS is supplied to the source diffusion layers and the substrate potential diffusion layers PW of the NMIS transistors MN1 to MN3 via metal lines. Furthermore, a device isolation insulating film is not formed between devices for the PMIS transistors MP1 to MP3 disposed toward the first direction. Moreover, a device isolation insulating film is not formed between devices for the NMIS transistors MP1 to MP3 disposed toward the first direction. On the other hand, a device isolation insulating film is formed between the NMIS transistor and PMIS transistor disposed toward the second direction. Note that the well potential diffusion layer NW and the substrate potential diffusion layer PW are formed to contact the device isolation insulating film.

The inverter circuit group according to the second embodiment is formed using field-effect transistors having high soft error tolerance explained in the first embodiment. If a soft error occurs in the circuit constantly operating such as a ring oscillator and a clock delay circuit, a defect may spread in other circuits and a defect may be generated in operation of the entire device. Generally, an error by spreading of the incorrect logic information is referred to as SEU (Single Event Upset) or SET (Single Event Transient) Therefore, applying the field-effect transistor of the present invention to the circuit constantly operating produces an enormous effect in avoiding defects by soft error.

Figure 11:
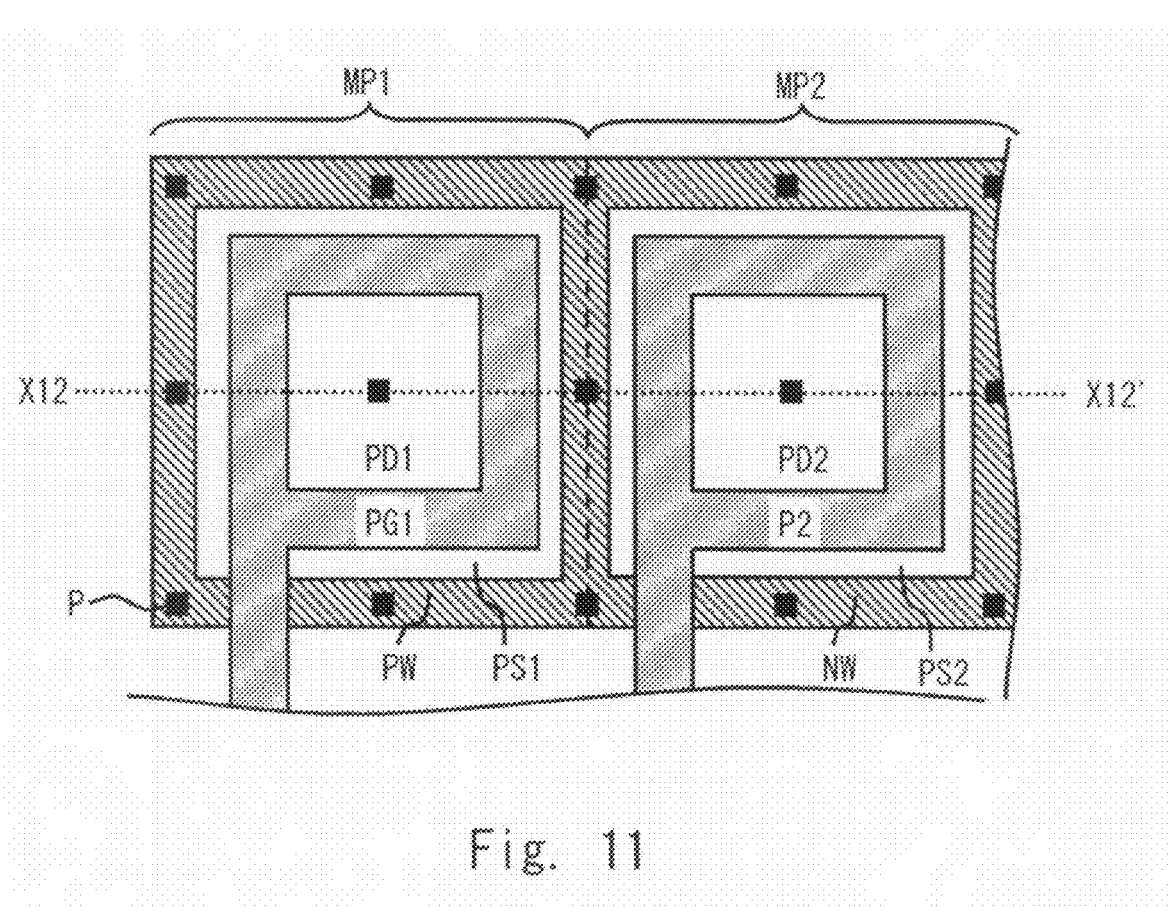
FIG. 11 is a layout diagram of a modification of the field-effect transistor according to the second embodiment.
Figure 12:
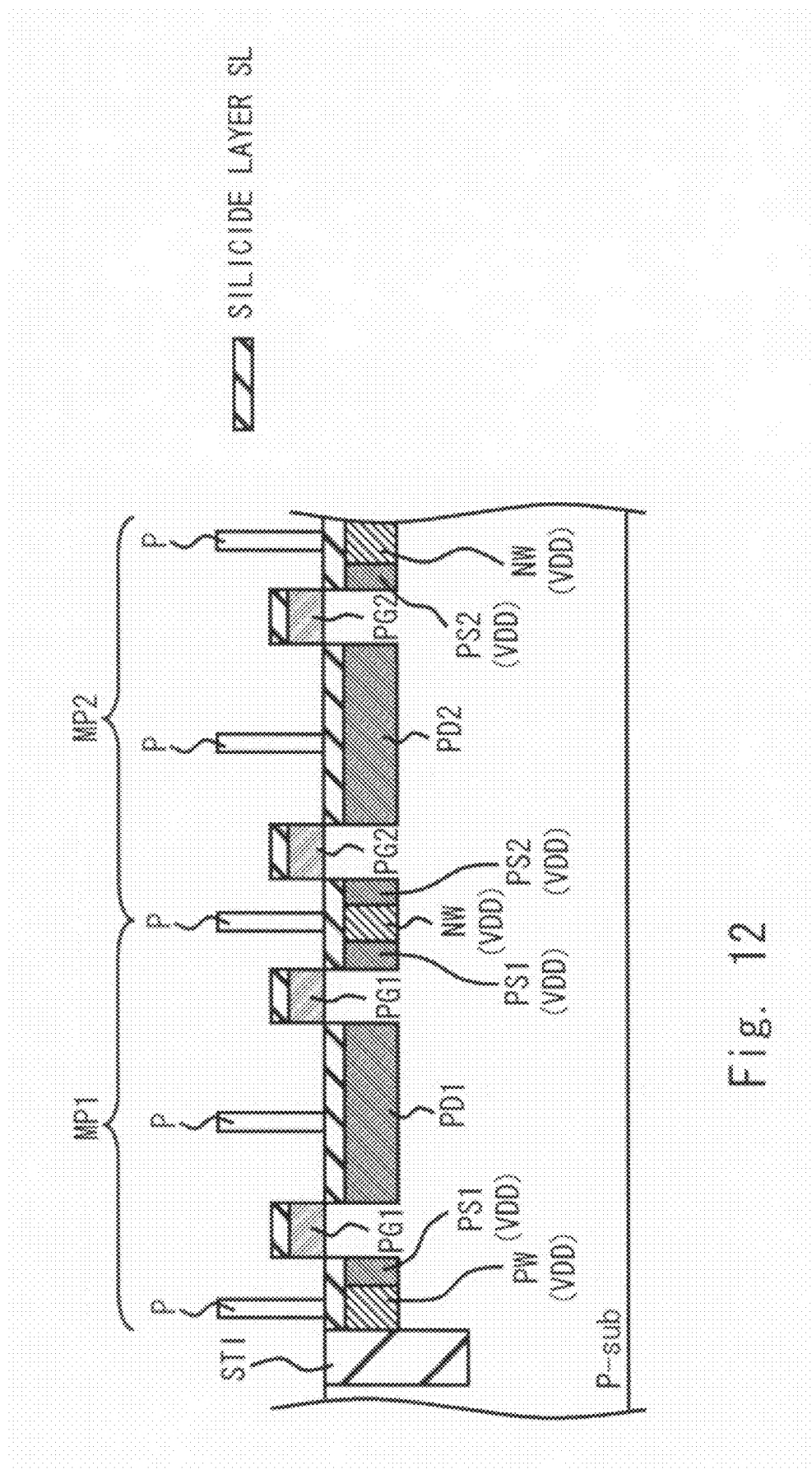
FIG. 12 is a cross-sectional diagram of the modification of the field-effect transistor according to the second embodiment.
Figure 13:
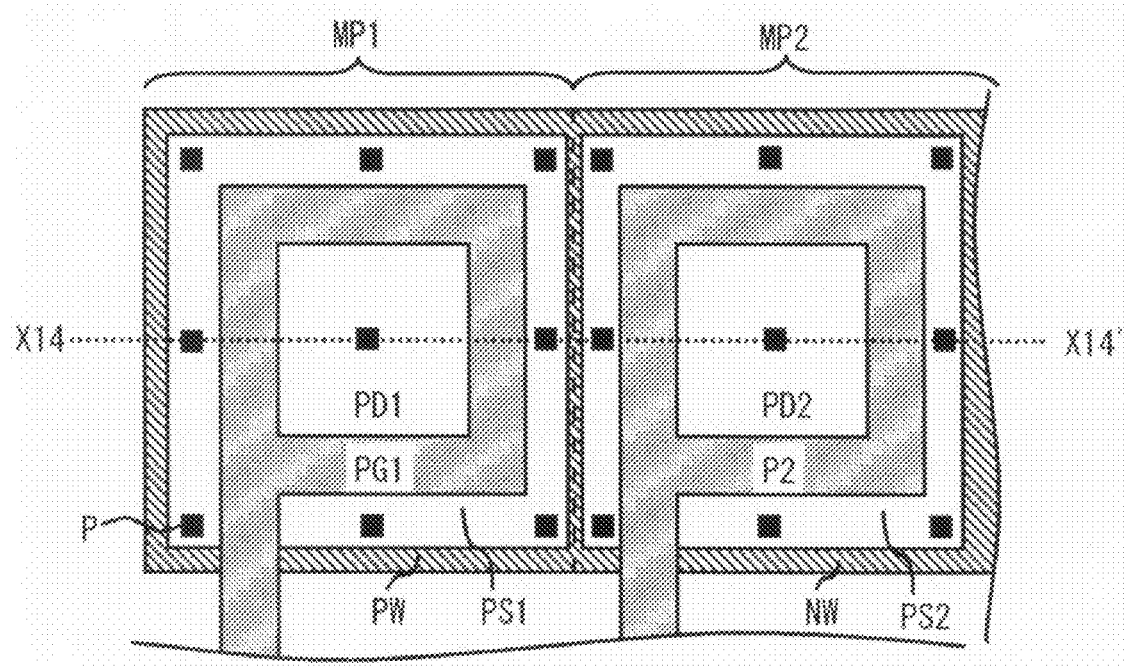
FIG. 13 is a layout diagram of the modification of the field-effect transistor according to the second embodiment.
Figure 14:
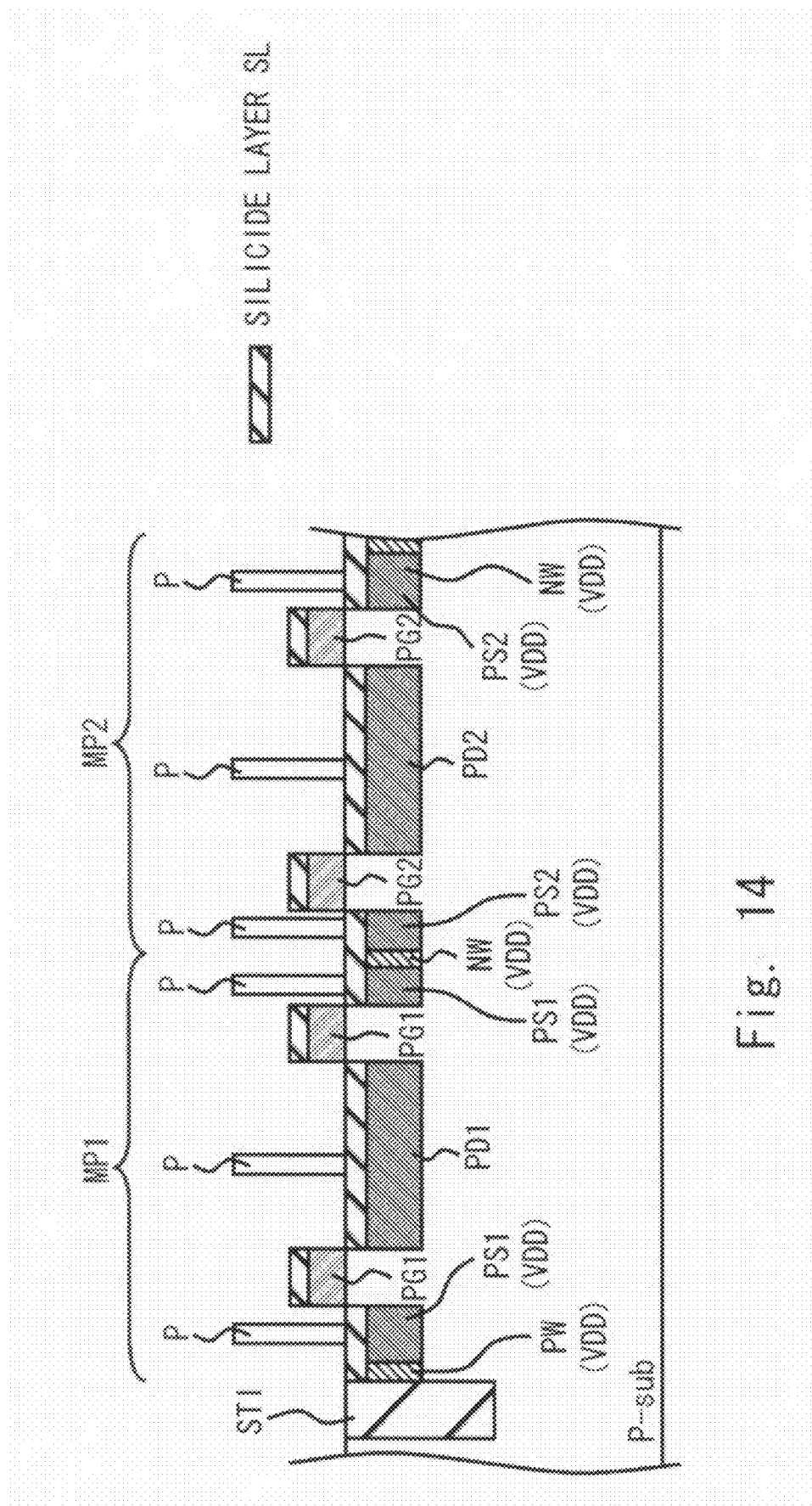
FIG. 14 is a cross-sectional diagram of the modification of the field-effect transistor according to the second embodiment.

Examples of the layout which is a modification of FIG. 10 without the contacts in the source diffusion layer are shown in FIGS. 11 and 13. Moreover, the cross-sectional diagrams corresponding to each of FIGS. 11 and 13 are shown in FIGS. 12 and 14. Note that in FIGS. 11 to 14, only the PMIS transistors MP1 and MP2 are shown for simplification. As shown in these drawings, as the butted contact diffusion layer and the source diffusion layer are connected by the silicide layer, there is no problem in supplying a source potential even if the contacts are not provided in the source diffusion layer. By having such structure, it is possible to reduce the area of the source diffusion layer. Only by having no contact in the source diffusion layer in the first direction, circuit block area can be reduced. Conversely, the contact may be provided only in the source diffusion layer and no contact may be provided in the butted diffusion layer.

Figure 15:
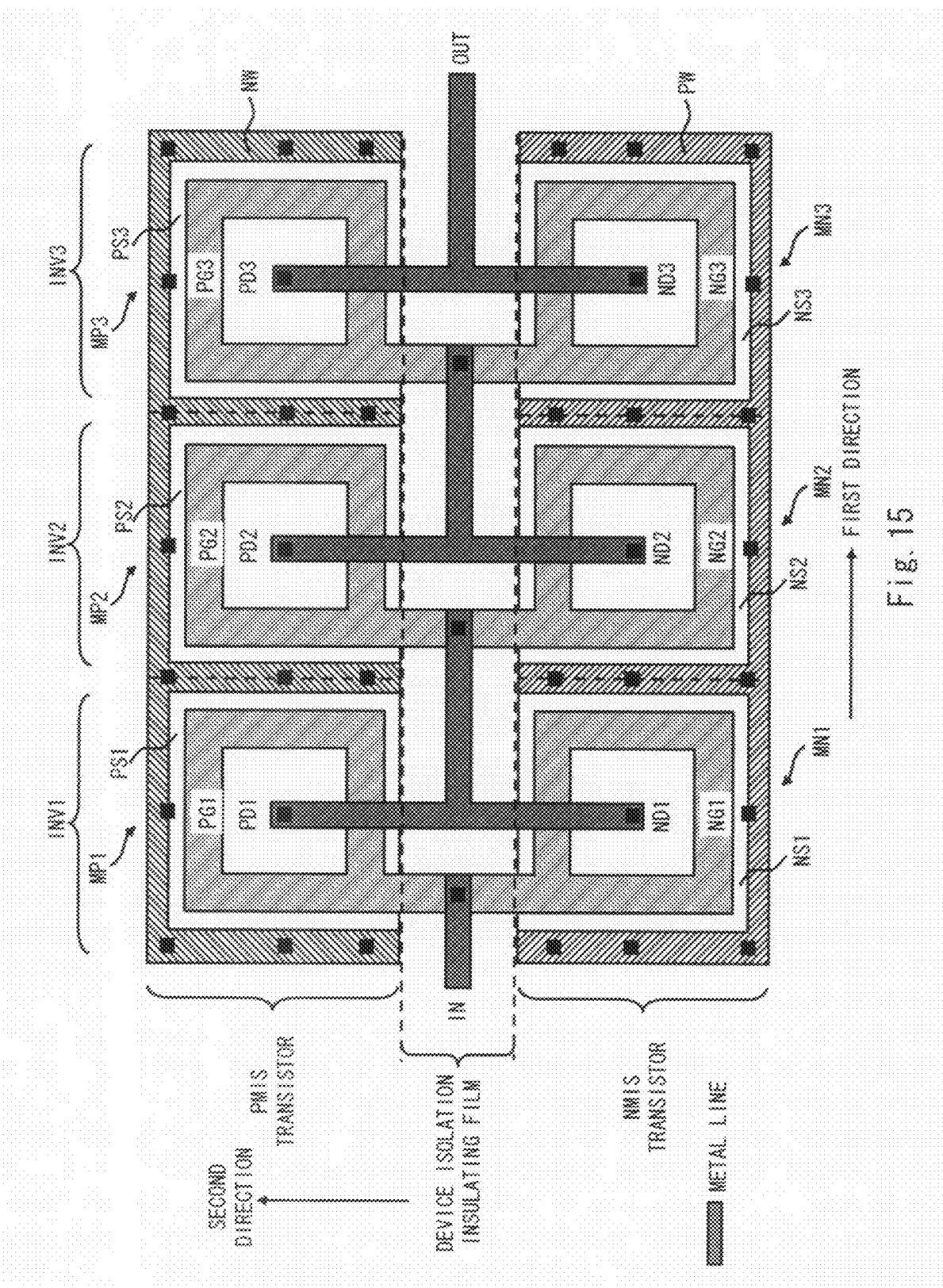
FIG. 15 is a layout diagram of the modification of the field-effect transistor according to the second embodiment.

Moreover, as another modification, an example of the layout having the butted contact diffusion layer formed to be a square shape with one side opened is shown in FIG. 15. As shown in FIG. 15, in this example, the butted contact diffusion layer is not formed to the side where the PMIS transistor and the NMIS transistor oppose in the second direction. Then, the PMIS transistor and the NMIS transistor are adjacent with a device isolation insulating film interposed therebetween. The distance between the sides becomes a certain length, even if the butted contact diffusion layer is not formed, since the field-effect transistors are adjacent with the device isolation insulating film interposed therebetween. Therefore, operation of the parasitic bipolar transistor formed between the PMIS transistor and the NMIS transistor is suppressed. That is, even if the field-effect transistors are made into such shape, it is possible to sufficiently reduce SER.

Third Embodiment

Figure 16:
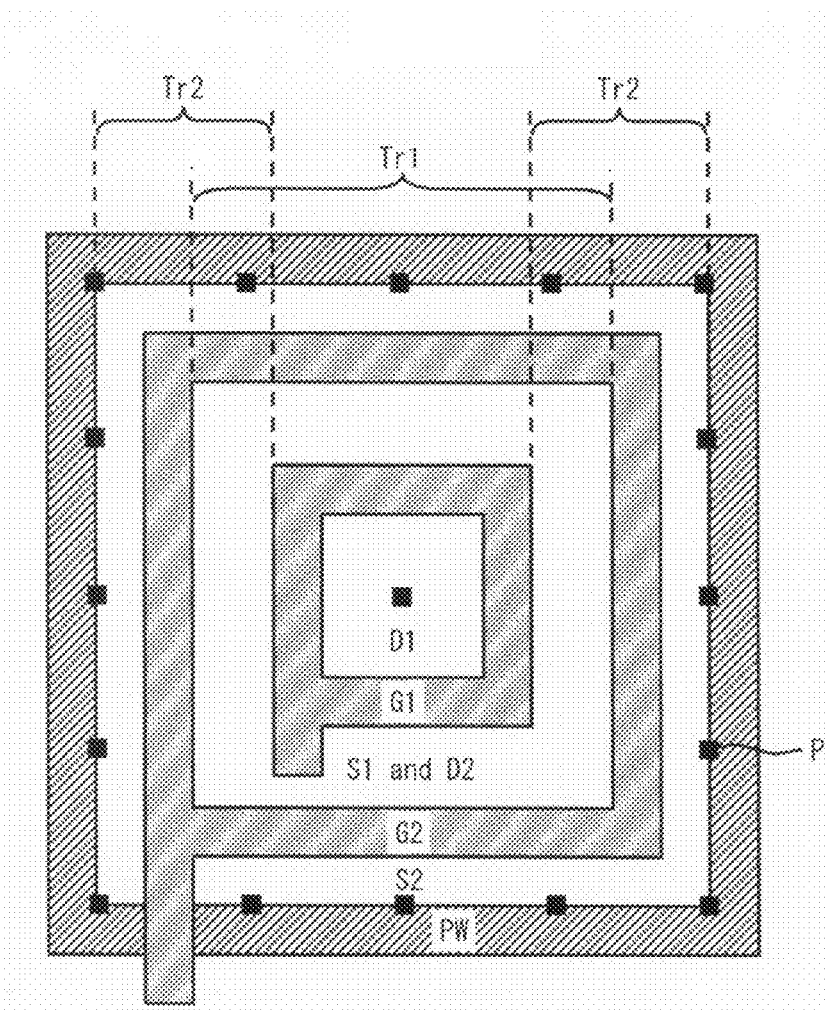
FIG. 16 is a layout diagram of a field-effect transistor according to a third embodiment.

A semiconductor integrated circuit device according to a third embodiment includes field-effect transistors of the same conductivity type connected in series. The layout diagram of the field-effect transistor according to the third embodiment is shown in FIG. 16. Note that a NMIS transistor is explained as an example of a field-effect transistor here.

As shown in FIG. 16, the semiconductor integrated circuit device according to the third embodiment includes a first field-effect transistor (for example NMIS transistor Tr1) and a second field-effect transistor (for example NMIS transistor Tr2). Moreover, the NMIS transistor Tr1 includes a first gate electrode G1, a first drain diffusion layer D1 and a first source diffusion layer S1. Furthermore, the NMIS transistor Tr2 includes a second gate electrode G2, a second drain diffusion layer D2 and a second source diffusion layer S2.

The first gate electrode G1 is formed as a ring shape. Then, the first drain diffusion layer D1 is formed to fill inside of the gate electrode G1. Moreover, the first source diffusion layer S1 is formed to surround the first gate electrode G1. This first source diffusion layer S1 also has a function as the second drain diffusion layer D2 of the NMIS transistor Tr2. The second gate electrode G2 is formed as a ring shape outside the second drain diffusion layer D2. The second source diffusion layer S2 is formed outside the second gate electrode G2. Furthermore, to the outside of this second source diffusion layer S2, the substrate potential diffusion layer PW is formed as a butted contact diffusion layer to surround the second source diffusion layer S2. Note that the substrate potential diffusion layer PW and the second source diffusion layer S2 are formed to be in contact and the surface thereof is covered with a silicide layer to be electrically connected.

Figure 17:
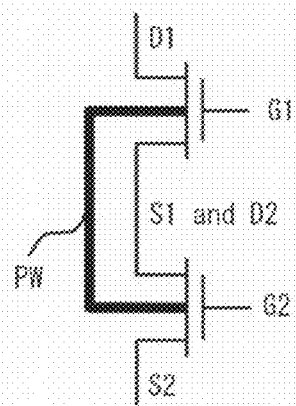
FIG. 17 is a representative circuit diagram of the field-effect transistor according to the third embodiment.
Figure 18:
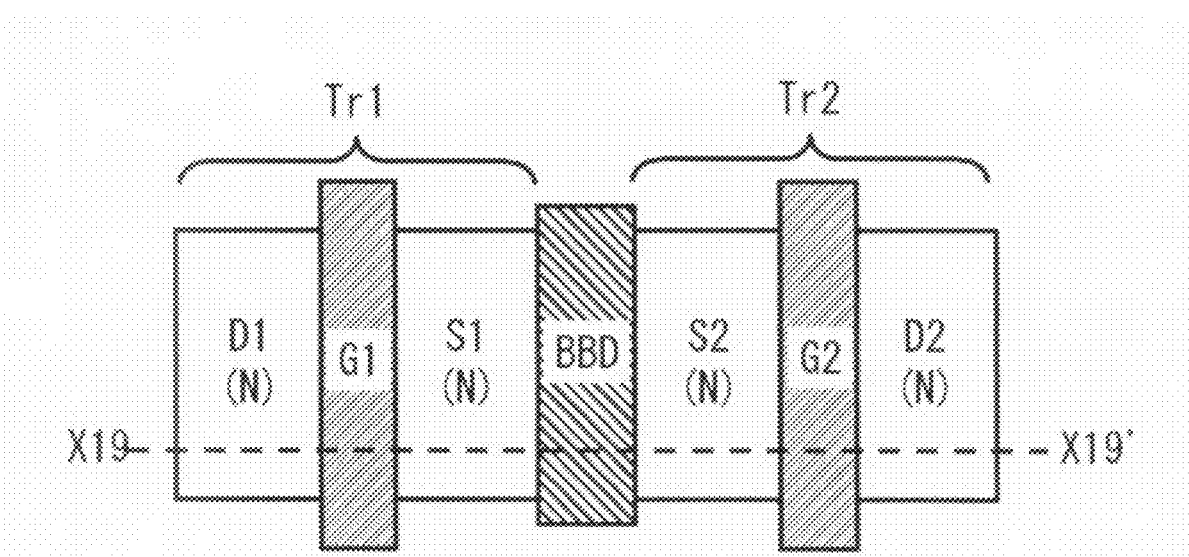
FIG. 18 is a layout diagram of a field-effect transistor according to a related art.
Figure 19:
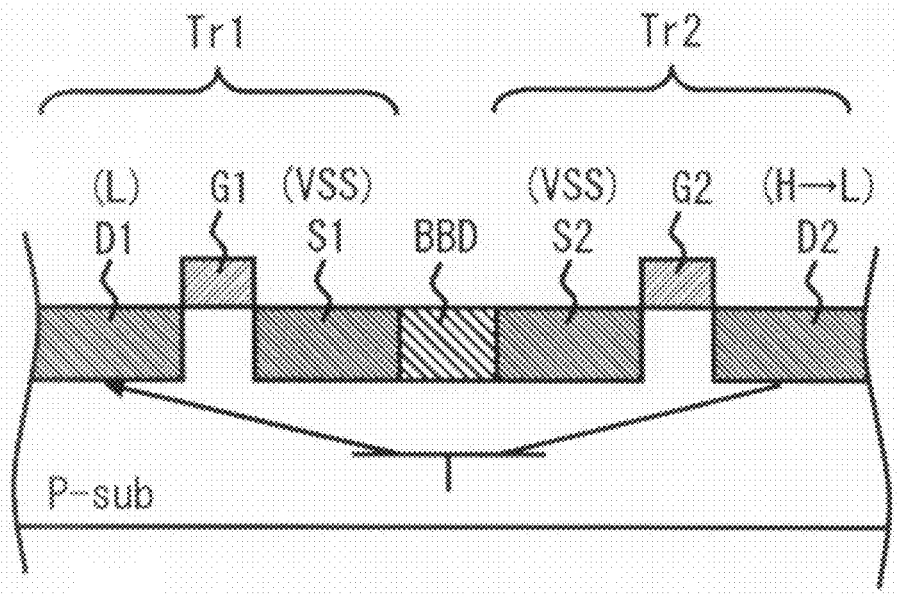
FIG. 19 is a cross-sectional diagram of the field-effect transistor shown in FIG. 18.
Figure 20:
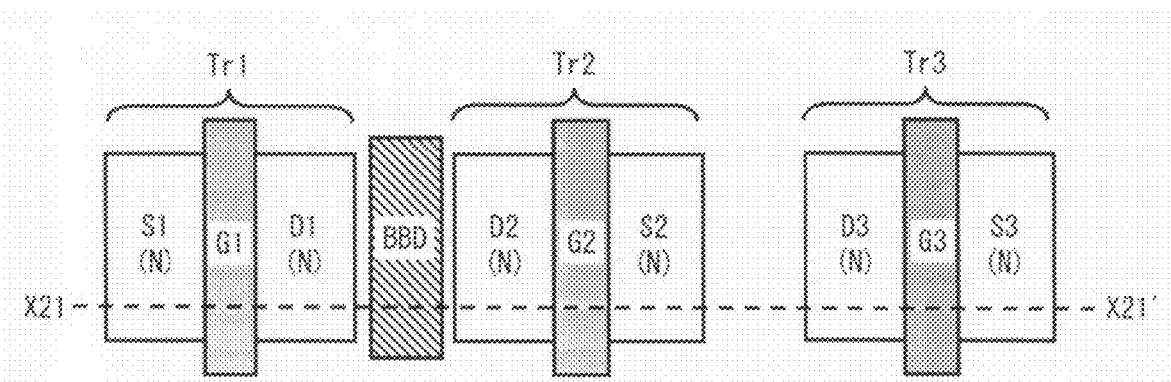
FIG. 20 shows another example of the layout of the field-effect transistor according to the related art.
Figure 21:
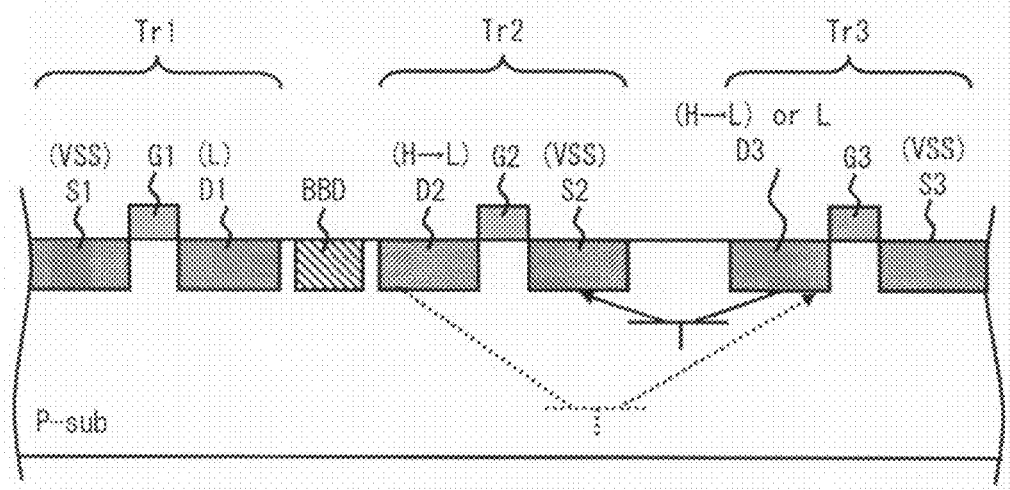
FIG. 21 is a cross-sectional diagram of the field-effect transistor shown in FIG. 20.

That is, the semiconductor integrated circuit device according to the third embodiment has the structure in which the 2 transistors are connected by the first source diffusion layer S1 and the second drain diffusion layer D2 sharing the same region. The representative circuit diagram of the semiconductor integrated circuit device according to the third embodiment is shown in FIG. 17. As shown in FIG. 17, the semiconductor integrated circuit device according to the third embodiment has the structure in which the NMIS transistors are connected in series and backgates of the NMIS transistors are electrically connected by the substrate potential diffusion layer PW. Note that also in the semiconductor integrated-circuit device according to the third embodiment, the first gate electrode G1 and the second gate electrode G2 are not electrically connected but the NMIS transistors Tr1 and Tr2 operate independently according to different signals.

The transistor of such connection is used in circuits such as a flip-flop circuit and a latch circuit. A flip-flop circuit and a latch circuit are circuits having an information storage node of a logical circuit. Moreover, for the semiconductor integrated circuit device according to the third embodiment, the tolerance over soft error can be improved even for a circuit like a flip-flop circuit or a latch circuit.

Note that the present invention is not limited to the above embodiments but may be changed without departing from the scope of the present invention. For example, semiconductors forming a transistor is not limited to those shown in the above embodiments but can be changed as appropriate.

It is apparent that the present invention is not limited to the above embodiments, but may be modified and changed without departing from the scope and spirit of the invention.

What is claimed is:

1. A semiconductor integrated circuit device comprising:
a first field-effect transistor and a second field-effect transistor, each of the first field-effect transistor and the second field-effect transistor having a gate electrode formed as a ring shape, a drain diffusion layer formed inside the gate electrode and a source diffusion layer formed outside the gate electrode;
a substrate potential diffusion layer or a well potential diffusion layer disposed to contact each of the source diffusion layers of the first and the second field-effect transistors of the same conductivity type, the substrate potential diffusion layer or the well potential diffusion layer being formed with a semiconductor of a different conductivity type from the source diffusion layer;
a first input line connected to the gate electrode of the first field-effect transistor;
a second input line connected to the gate electrode of the second field-effect transistor,
wherein:
the second input line is different from the first input line,
the substrate potential diffusion layer or the well potential diffusion layer is formed between the source diffusion layer of the first field-effect transistor and the source diffusion layer of the second field-effect transistor, and
no isolation insulating film is disposed between the source diffusion layer of the first field-effect transistor and the source diffusion layer of the second field-effect transistor,
wherein the gate electrode of the first field-effect transistor is electrically isolated from the gate electrode of the second field-effect transistor.

2. The semiconductor integrated circuit device according to claim 1, wherein the substrate potential diffusion layer or the well potential diffusion layer is disposed to surround the source diffusion layer.

3. The semiconductor integrated circuit device according to claim 1, wherein the substrate potential diffusion layer or the well potential diffusion layer are connected with the source diffusion layer by a silicided diffusion layer.

4. The semiconductor integrated circuit device according to claim 3, further comprising a contact provided over a boundary line between the source diffusion layer and the substrate potential diffusion layer or the well potential diffusion layer.

5. The semiconductor integrated circuit device according to claim 3, wherein a contact is provided to only one of the source diffusion layer and the substrate potential diffusion layer or the well potential diffusion layer.

6. The semiconductor integrated circuit device according to claim 1, wherein at least one of the first and the second field-effect transistor is part of a flip-flop circuit or a latch circuit.

7. The semiconductor integrated circuit device according to claim 1, wherein the first field-effect transistor and the second field-effect transistor are part of a SRAM cell circuit.

8. The semiconductor integrated circuit device according to claim 1, further comprising:
a field-effect transistor of a first conductivity type corresponding to either the first field-effect transistor or the second field-effect transistor; and
a field-effect transistor of a second conductivity type,
wherein the a field-effect transistor of the first conductivity type has a gate electrode formed as a ring shape, a drain diffusion layer of the first conductivity type formed inside the gate electrode, a source diffusion layer of the first conductivity type formed outside the gate electrode and a substrate potential diffusion layer or a well potential diffusion layer of a second conductivity type different from the first conductivity type, the substrate potential diffusion layer or the well potential diffusion layer being formed outside the source diffusion layer to be in contact with the source diffusion layer of the first conductivity type;
the field-effect transistor of the second conductivity type has a gate electrode formed as a ring shape, a drain diffusion layer of the second conductivity type formed inside the gate electrode, a source diffusion layer of the second conductivity type formed outside the gate electrode and a well potential diffusion layer or a substrate potential diffusion layer of the first conductivity type different from the second conductivity type, the well potential diffusion layer or the substrate potential diffusion layer being formed outside the source diffusion layer to be in contact with the source diffusion layer of the second conductivity type,
the field-effect transistor of the first conductivity type is connected by a silicided diffusion layer to make the source diffusion layer of the first conductivity type be the same potential as the substrate potential diffusion layer or the well potential diffusion layer of the second conductivity type,
the field-effect transistor of the second conductivity type is connected by a silicided diffusion layer to make the source diffusion layer of the second conductivity type be the same potential as the well potential diffusion layer or the substrate potential diffusion layer of the first conductivity type, and
the field-effect transistor of the first conductivity type and the field-effect transistor of the second conductivity type satisfy either to input the same signal to each of the gate electrodes or that each of the drain diffusion layers are the same potential.

9. The semiconductor integrated circuit device according to claim 8, wherein the field-effect transistor of the first conductivity type and the field-effect transistor of the second conductivity type are adjacent with an insulating film which isolates a device interposed therebetween, and the substrate potential diffusion layer or the well potential diffusion layer of the second conductivity type and the well potential diffusion layer or the substrate potential diffusion layer of the first conductivity type respectively contact the insulating film which isolates the device.

10. The semiconductor integrated circuit device according to claim 8, wherein the field-effect transistor of the first conductivity type and the field-effect transistor of the second conductivity type operate as an inverter circuit.

11. The semiconductor integrated circuit device according to claim 10, wherein the inverter circuit operates as a part of an oscillator having a plurality of the inverter circuits connected in series.

12. The semiconductor integrated circuit device according to claim 8, wherein a plurality of the field-effect transistors of the first conductivity type and a plurality of the field-effect transistors of the second conductivity type are formed without intervening an insulating film which isolates a device in a first direction parallel to a boundary surface between the field-effect transistor of the first conductivity type and the field-effect transistor of the second conductivity type.

13. The semiconductor integrated circuit device according to claim 8, wherein the plurality of the field-effect transistors of the first conductivity type are adjacent without intervening the substrate potential diffusion layer or the well potential diffusion layer of the second conductivity type in the first direction parallel to a boundary surface between the field-effect transistor of the first conductivity type and the field-effect transistor of the second conductivity type, and the plurality of the field-effect transistors of the second conductivity type are formed to be adjacent without intervening the well potential diffusion layer or the substrate potential diffusion layer of the first conductivity type in the first direction.

14. A semiconductor integrated circuit device comprising:
a first field-effect transistor having a first gate electrode formed as a ring shape, a first drain diffusion layer formed inside the first gate electrode and a first source diffusion layer formed outside the first gate electrode;
a second field-effect transistor using the first source diffusion layer inside a second gate electrode formed as a ring shape outside the first gate electrode as a second drain diffusion layer and having a second source diffusion layer formed outside the second gate electrode; and
a substrate potential diffusion layer or a well potential diffusion layer of a conductivity type different from the second source diffusion layer formed in the periphery of the second source diffusion layer to be in contact with the second source diffusion layer.

* * * * *